United States Patent [19]
Kamiya

[11] Patent Number: 5,625,286
[45] Date of Patent: Apr. 29, 1997

[54] DIGITAL MULTIMETER HAVING AN IMPROVED DESIGN AGAINST MECHANICAL SHOCK

[75] Inventor: Manabu Kamiya, Suwa, Japan

[73] Assignee: Seiko Epson Corporation, Tokyo, Japan

[21] Appl. No.: 383,983

[22] Filed: Feb. 6, 1995

[30] Foreign Application Priority Data

Apr. 1, 1994 [JP] Japan .................................. 6-065217

[51] Int. Cl.$^6$ .............................. G01R 15/12; G01R 1/04
[52] U.S. Cl. ........................................ 324/156; 361/728
[58] Field of Search ................................ 324/156, 157; 361/392, 394, 395, 393, 399

[56] References Cited

U.S. PATENT DOCUMENTS

| | | |
|---|---|---|
| 4,951,834 | 8/1990 | Aikins . |
| 4,994,734 | 2/1991 | Germer et al. .......................... 324/156 |
| 5,084,670 | 1/1992 | Melenotte ................................ 324/156 |

OTHER PUBLICATIONS

Nihon Keizai Shinbun (Japan Economic News) of Feb. 8, 1994.

*Primary Examiner*—Walter E. Snow
*Attorney, Agent, or Firm*—Oliff & Berridge

[57] ABSTRACT

A digital multimeter having a structure built to withstand mechanical shock. The digital multimeter has an enclosure in which there is disposed a shielding or protecting plate provided with an elastic projection for pressing a liquid crystal panel toward a side of the enclosure and a battery holding projection for holding a battery mounted on a battery holder. The shielding or protecting plate is supported on the side of the enclosure. The shielding or protecting plate is also provided with a partition plate for fixing a crystal resonator element mounted on the circuit board. On the side of the enclosure, there is provided a pair of projections to prevent a fuse from moving. Thus, component elements disposed in the digital multimeter, which may leave their given location due to mechanical shock applied, for example, when the digital multimeter is dropped are "fixed" by, among other things, the shielding plate and the enclosure thereby improving the multimeter's resistance against mechanical shock.

31 Claims, 8 Drawing Sheets

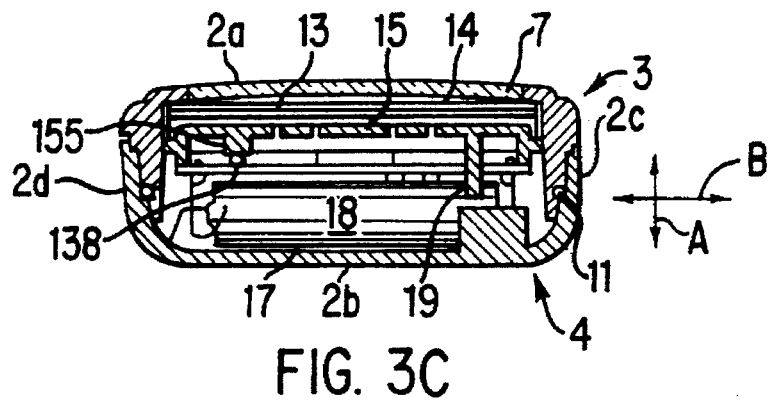
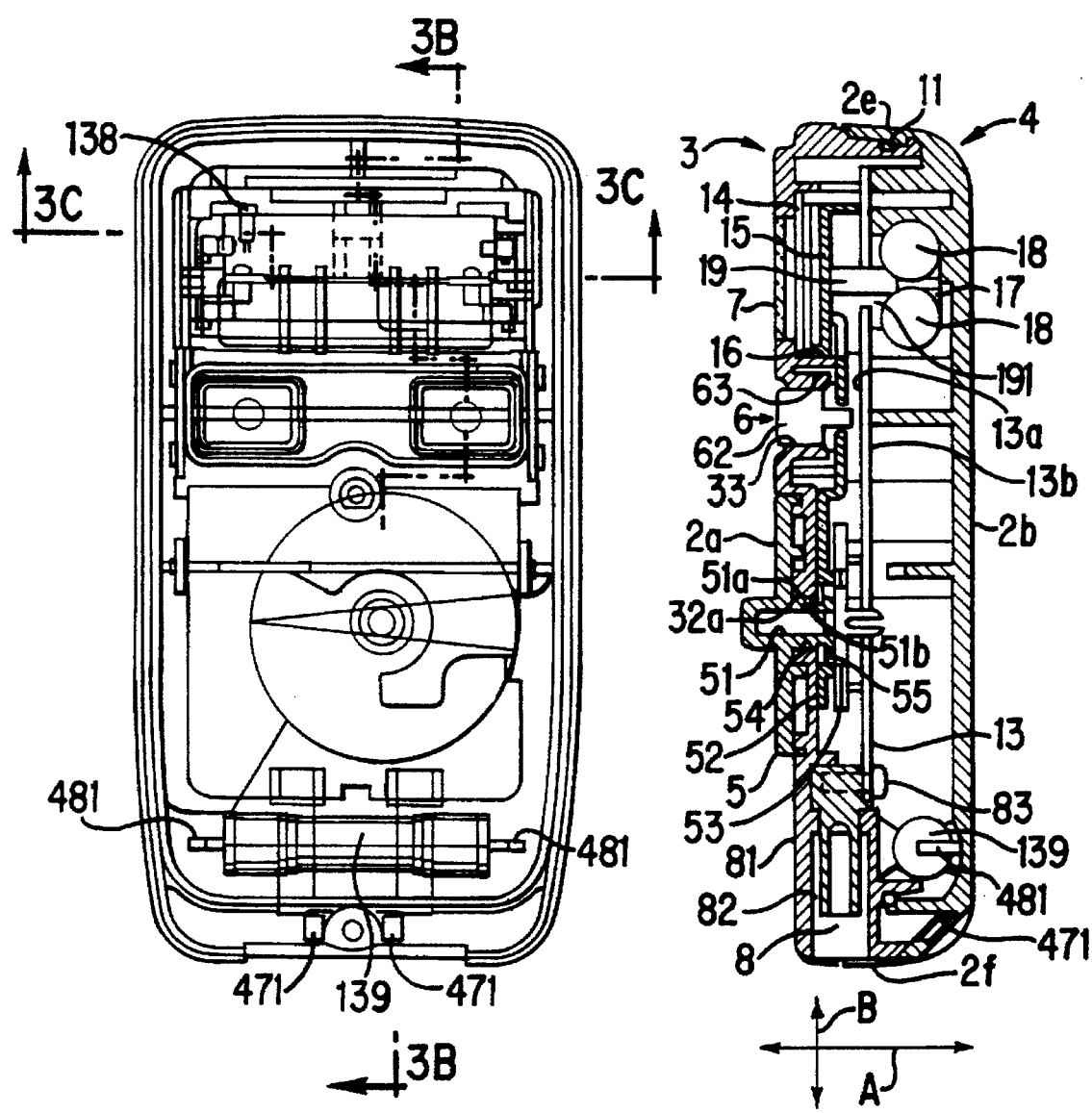
FIG. 3C
FIG. 3A    FIG. 3B

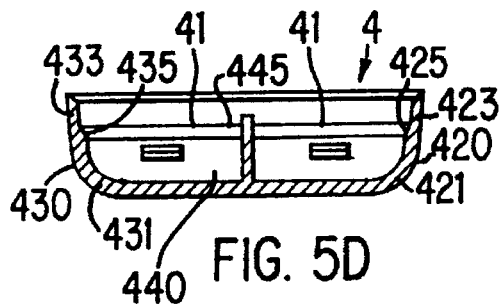
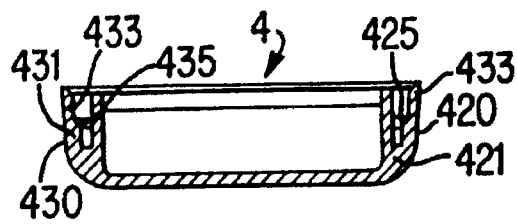
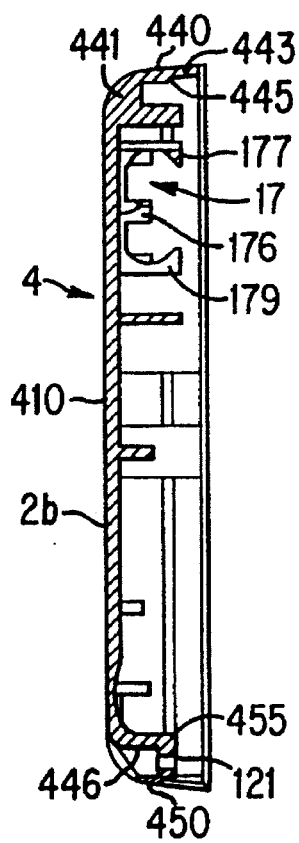
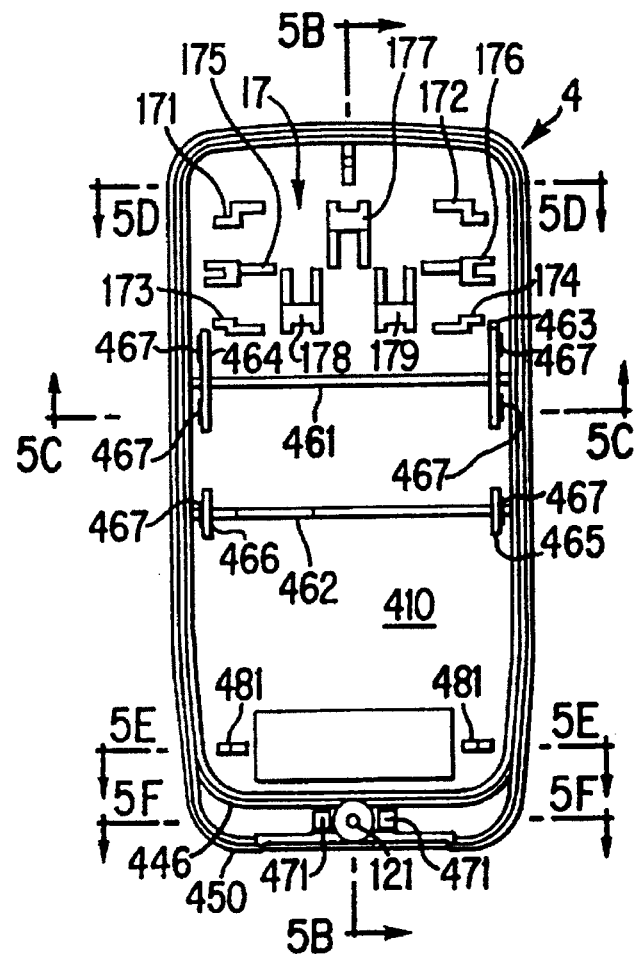
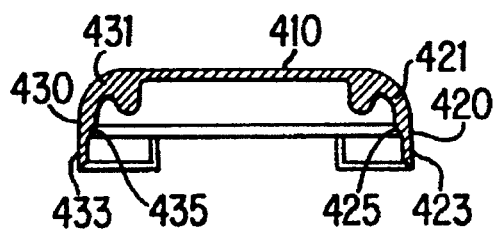
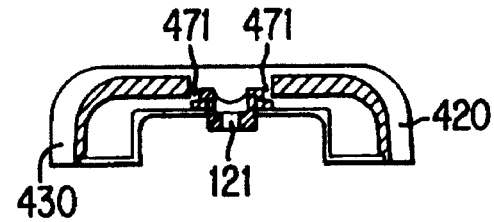
FIG. 5D
FIG. 5C
FIG. 5B
FIG. 5A
FIG. 5E
FIG. 5F

DIGITAL MULTIMETER HAVING AN IMPROVED DESIGN AGAINST MECHANICAL SHOCK

BACKGROUND OF THE INVENTION

1. Field of the Invention

The invention relates to a digital multimeter for measuring current, voltage, etc., and particularly to a digital multimeter having strong resistance against mechanical shock such as that applied when it is dropped.

2. Description of the Related Art

Digital multimeters are typically provided with a rotary switch, a display window, and other elements disposed on the front surface of its enclosure so that various kinds of electrical parameters can be measured by selecting a desired parameter and a proper range via the rotary switch. Such a conventional digital multimeter is disclosed in U.S. Pat. No. 4,951,834. As shown in FIG. 1 of the above patent, a digital multimeter has an enclosure which can be carried by one hand, wherein component elements such as a circuit board and a battery are disposed inside the enclosure. If such a digital multimeter is dropped, massive component elements such as a battery may be moved by the mechanical shock or vibration and thus other circuit elements disposed adjacent to them may be damaged. Even the circuit board itself may be broken.

SUMMARY OF THE INVENTION

In view of the above, it is an object of the invention to provide a digital multimeter with a structure having strong resistance against mechanical shock and vibration.

According to an aspect of the invention to achieve the above object, there is provided a digital multimeter including an enclosure comprising an upper enclosure and a lower enclosure, the enclosure further comprising a circuit board on which measuring circuit elements and the like are mounted; a shielding or protecting plate for shielding and protecting the circuit elements mounted on the circuit board; a battery; and a display panel disposed at the back side of a transparent display window formed in the upper enclosure; the digital multimeter being characterized in that the shielding or protecting plate is provided with an elastic projection for elastically pressing the display panel toward the upper enclosure.

In this structure, the display panel such as a liquid crystal cell is always pressed elastically by the shielding plate toward the side of the upper enclosure. As a result, when mechanical shock is applied to the digital multimeter, the elastic projection serves as a buffer element and absorbs the mechanical shock thereby preventing the mechanical shock from acting directly to the display panel, preventing it from being broken.

In this structure according to the invention, the shielding plate or protecting plate is preferably provided with a battery holding projection for pressing the battery toward said enclosure. Thus, a heavy battery is fixed to the side of the enclosure, which prevents the battery from moving and further leaving the given position and thus prevents other circuit elements and the circuit board from being damaged.

Thus the shielding plate acts as a protecting plate to protect the display panel, the battery, the circuit board and other circuit elements from mechanical shock that would damage those elements.

In the above structure according to the invention, the shielding plate or protecting plate is disposed between the circuit board and the upper enclosure, in such a manner that the shielding plate is supported on the side of the enclosure. With this structure, mechanical shock or vibration is cut off by the shielding plate and the enclosure. Thus, mechanical shock is not applied to the internal circuit board and the circuit elements mounted on it. Thus, the circuit board and the circuit elements are protected from the mechanical shock. In this structure, a battery holder may be disposed in the lower enclosure at a position corresponding to the shielding plate and a battery holding projection may extend from the shielding plate toward the battery holder through the circuit board.

In another embodiment of the invention, at least either the upper enclosure or the lower enclosure is provided with a holding projection for fixing at least one of the circuit elements mounted on the surface of the circuit board. That is, in the present invention, heavy circuit elements or such circuit elements that may leave their given position when mechanical shock is applied, for example a fuse, crystal resonator element, etc., are fixed by the projection disposed in the enclosure, thereby preventing these elements from separating from the circuit board.

As a matter of course, the projections for holding the circuit elements may also be disposed on the shielding plate. For example, a projection for holding a crystal resonator element may be disposed on the shielding plate.

In another embodiment of the present invention, an input terminal used for connection with an external terminal, that may leave its given position when mechanical shock or vibration is applied, is fixed to the circuit board using a screw. With this arrangement, it is possible to improve the resistance of this portion against mechanical shock.

BRIEF DESCRIPTION OF THE DRAWINGS

FIG. 3A is a schematic diagram illustrating the layout of various component elements of the digital multimeter shown in FIG. 1;

FIG. 3B is a cross-sectional view taken along the line 3B—3B of FIG. 3A;

FIG. 3C is a cross-sectional view taken along the line 3C—3C of FIG. 3A;

FIG. 5A is a schematic diagram illustrating a plan view of the lower enclosure of the digital multimeter shown in FIG. 1;

FIG. 5B is a cross-sectional view taken along the line 5B—5B of FIG. 5A;

FIG. 5C is a cross-sectional view taken along the line 5C—5C of FIG. 5A;

FIG. 5D is a cross-sectional view taken along the line 5D—5D of FIG. 5A;

FIG. 5E is a cross-sectional view taken along the line 5E—5E of FIG. 5A;

FIG. 5F is a cross-sectional view taken along the line 5F—5F of FIG. 5A;

DESCRIPTION OF THE PREFERRED EMBODIMENTS

Referring to the accompanying drawings, preferred embodiments of the invention will be described below.

Figure 1:
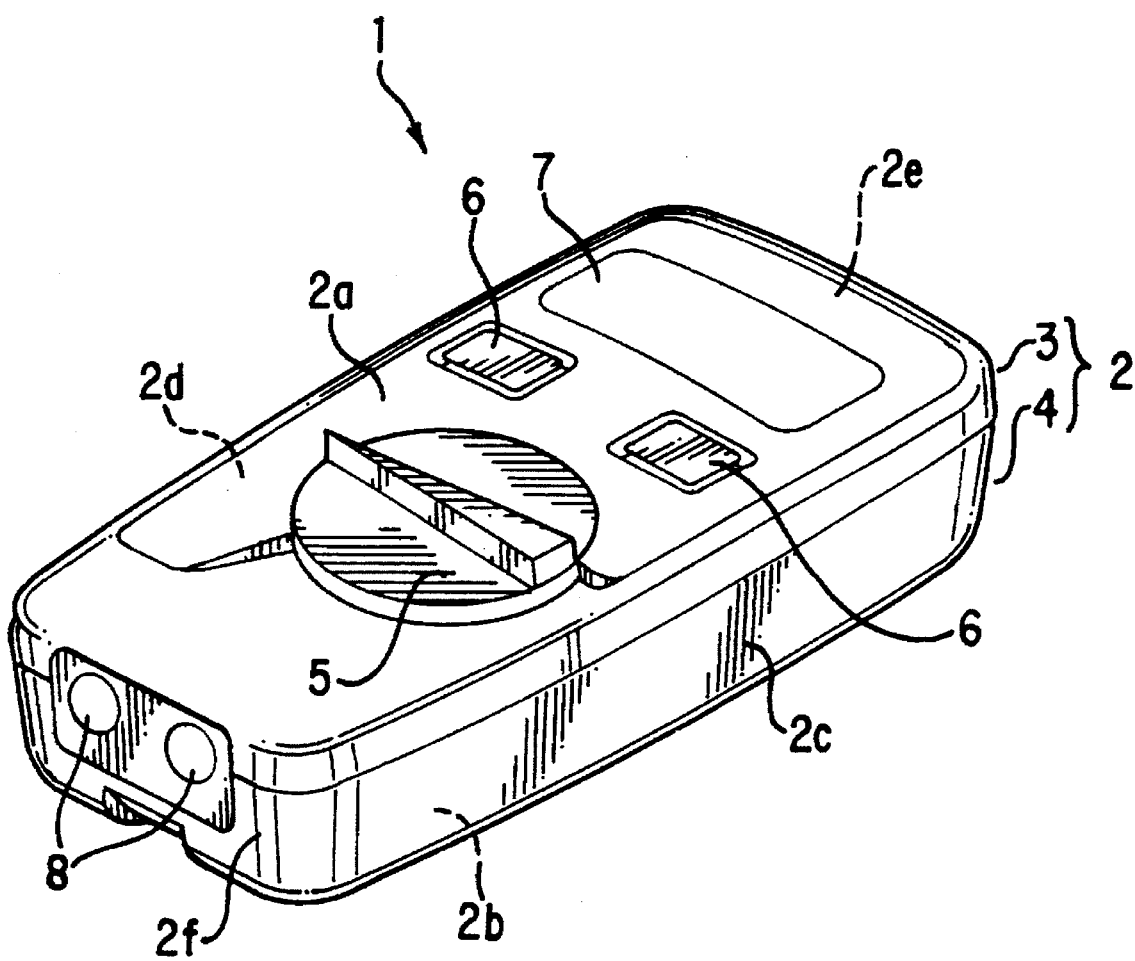
FIG. 1 is a perspective view illustrating the external appearance of a digital multimeter according to one embodiment of the present invention.

FIG. 1 illustrates the external appearance of a digital multimeter according to an embodiment of the present invention. As shown in this figure, the digital multimeter 1 of the present embodiment has an enclosure 2 with a generally flat and rectangular shape in which various circuit elements are installed. The enclosure 2 comprises an upper enclosure 3 disposed on the front side and a lower enclosure 4 disposed on the back side, wherein the surface of the upper enclosure 3 serves as an operating panel 2a, and the surface of the lower enclosure 4 is the back face 2b of the enclosure. The operating panel 2a and the back face 2b are connected continuously to each other via right and left sides 2c and 2d. On the operating panel of the upper enclosure 3 there are disposed operating elements including a rubber key 6 for turning the electric power on and off and a knob 5 serving as a rotary switch for selecting an electrical parameter to be measured along with its measuring range. A display window 7 made up of a transparent material is disposed in an area of the operating panel near an upper side 2e. Furthermore, a pair of external terminal insertion holes 8 are disposed on a lower side 2f. The upper side 2e disposed on the opposite location is slightly wider than the lower side 2f.

Figure 2:
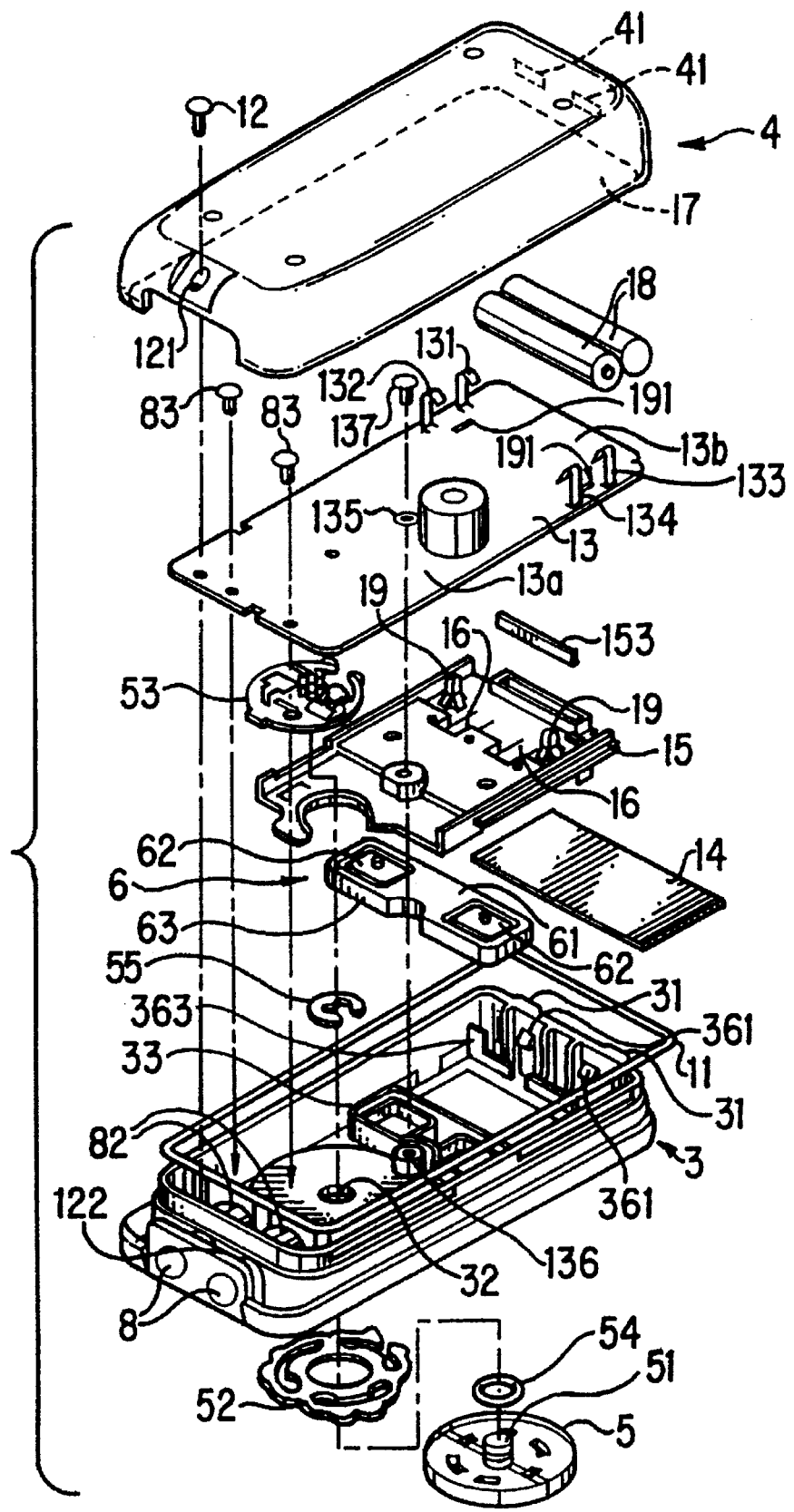
FIG. 2 is an exploded perspective view of the digital multimeter shown in FIG. 1.

FIG. 2 is an exploded perspective view illustrating main component elements of the digital multimeter 1 according to an embodiment of the invention. In this figure, the digital multimeter 1 is seen from its back face. FIG. 3 is a cross-sectional view of the digital multimeter 1 which illustrates the layout of the component elements disposed inside the digital multimeter. FIG. 3B is a longitudinal sectional view taken along the section line 3B—3B, and FIG. 3C is a transverse sectional view taken along the section line 3C—3C.

The upper enclosure 3 and the lower enclosure 4 composing the enclosure 2 are connected to each other at a connection interface via an elastic sealing material or a packing 11 having a circular cross section disposed between them. The connection interface has a certain angle with respect to the thickness direction A of the enclosure 2 thereby forming a sealing mechanism at the connection interface between the upper and lower enclosures. At the lower side face 2f of the enclosure, these upper and lower enclosures 3 and 4 are fastened to each other using one enclosure fastening screw 12. At the opposite side 2e, the upper and lower enclosures are fixed to each other via a pair of fitting projections 31, 31 formed on the upper enclosure and a pair of fitting grooves 41, 41 formed on the lower enclosure such that the pair of projections 31, 31 are fitted into the corresponding grooves 41, 41.

A rotary shaft 51 is formed in an integral form in the center of the back side of the knob 5 of the rotary switch. The shaft 51 extends toward the inside of the enclosure via a rotary switch fixing opening 32 formed in the upper portion of the enclosure 3. A click rotor 52 is attached to the perimeter of the shaft 51 extending toward the inside of the enclosure so that the rotary position of the rotary switch is defined by the click rotor 52. A rotor 53 is attached to the back face of the rotor 52 in such a manner that a brush contact attached to the rotor 53 can slide on contacts formed on a circuit board 13 thereby making electrical contact with one of these contacts. A ring-shaped elastic sealing material or an O-ring 54 whose cross section has a circular shape is disposed between the shaft 51 of the rotary switch and the opening 32 thereby providing a sealing mechanism at the boundary between the shaft 51 and the opening 32. As for the sealing between the rubber key 6 serving as an operating element and the fixing opening 33 formed in the upper enclosure 3, there is provided a double sealing mechanism that will be described in more detail later. Furthermore, in the present embodiment of the invention, the display window 7 is formed by means of two-color molding in such a manner that the display window 7 is integral with the upper enclosure 3, so as to ensure good sealing at the periphery of the display window 7, as will be described later.

In the inside of the enclosure 2, the circuit board 13 on which circuit elements are mounted is disposed at a position which corresponds to the center of the thickness dimension of the enclosure along a plane B substantially parallel to the upper and lower enclosures 3 and 4; that is, in the direction perpendicular to a thickness direction A of the enclosure. A liquid crystal display panel 14 is disposed on the back face of the upper enclosure 3 at a position corresponding to the display window 7 and a shielding or protecting plate 15 is disposed between the liquid crystal display panel 14 and the circuit board 13. The liquid crystal panel 14 is pressed by a pair of projections 16, 16 formed on the shielding plate 15 so that the liquid crystal display panel 14 is fixed to the back face of the upper enclosure 3. In the lower enclosure 4, there is provided a battery holder 17 at a location opposite to the shielding or protecting plate 15 via the circuit board 13. Two batteries 18 are installed in the battery holder 17 in this example. The batteries 18 installed in the battery holder 17 are fixed by battery holding projections 19 formed on the shielding or protecting plate 15. The battery holding projections 19 extend through the circuit board 13 into the lower enclosure 4.

Referring mainly to FIG. 4 illustrating the upper enclosure 3, the structure of the upper enclosure 3 will be described below. In the present embodiment of the invention, the upper enclosure 3 comprises: an upper wall 310 defining the operation panel 2a of the enclosure; side wall portions 320 and 330 forming right and left side faces of the enclosure; and side wall portions 340 and 350 forming upper and lower side faces of the enclosure. In the side walls 320, 330 and 340, their base end portions continuing to the upper wall, form thick wall portions 321, 331 and 341. The intermediate portions form moderate-thickness wall portions 322, 332 and 342, and the end portions form thin wall portions 323, 333 and 343 such that each side wall has two steps 324, 325, 334, 335, and 344, 345. On the other hand, the lower side wall portion 350 of the enclosure comprises an outer wall 358 and an inner wall 359 each continuing to the right and left side wall portions 320 and 330. The base portion of the inner wall 359 forms a moderate-thickness wall portion (not shown in drawings), and the end portion of the inner wall 359 forms a thin wall portion 353 wherein a step 355 is formed between the thin wall portion 353 and the moderate-thickness wall portion.

In the right and left side wall portion 320, 330 and the upper side wall portion 340, raised portions 326, 336, 346 are formed partially on the outer side faces of the thin wall portions 323, 333, 343 thereby forming grooves 327, 337 and 347 between the raised portions and the steps 325, 335, 345 so that the grooves 327, 337, 347 receive the packing 11 thereby preventing the packing 11 from dropping off.

FIG. 5 illustrates the lower enclosure 4. The lower enclosure 4 comprises: a lower wall 410 defining the back face 2b of the enclosure; side wall portions 420 and 430 forming the right and left side faces of the enclosure; and side wall portions 440 and 450 forming the upper and lower side faces of the enclosure. In the side walls 420, 430, 440, 450, their base portions continuing to the upper wall, form thick wall portions 421, 431, 341, 351. Their end portions form thin wall portions 423, 433, 443, and 453, wherein sloped steps 425, 435, 445 and 455 are formed between the thin and thick wall portions. The lower side wall portion 450 has an inner wall 446 provided with the sloped step 445 formed at its end portion. The inner wall 446 is separately disposed at an inner position.

Figure 6:
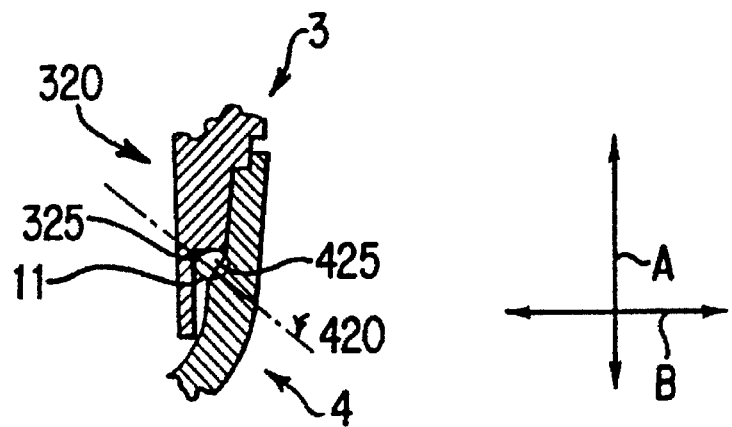
FIG. 6 is an enlarged fragmentary cross-sectional view illustrating a sealing mechanism according to an embodiment of the invention for sealing a connection interface between upper and lower enclosures of the digital multimeter shown in FIG. 1.
Figure 7:
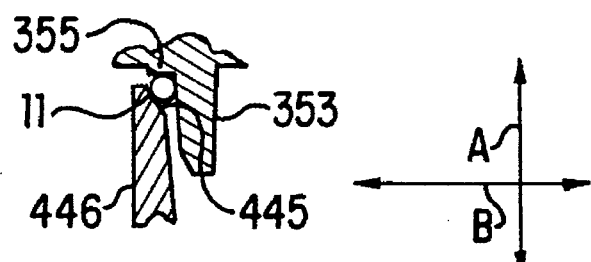
FIG. 7 is an enlarged fragmentary cross-sectional view illustrating a sealing mechanism according to another embodiment of the invention for sealing a connection interface between the upper and lower enclosures of the digital multimeter shown in FIG. 1.

On the side wall portion of the upper enclosure 3, as described above, steps 325, 335, 345, 355 are formed in a continuous fashion at the same height. On the side wall portion of the lower enclosure 4, sloped steps 425, 435, 445, 455 are formed in a continuous fashion at the same height. As described above, the upper enclosure 3 and the lower enclosure 4 are combined together via the packing 11. As shown in FIGS. 6 and 7 in an enlarged fashion, the packing 11 is pressed by the steps formed on the upper and lower enclosures and crushed by a proper amount. In the present embodiment of the invention, the steps 425, 435, 445, 455 of the lower enclosure 4 are formed in a sloped shape as described above. Therefore, the packing 11 is pressed and crushed in a direction at a certain angle to the thickness direction A of the enclosure or the vertical direction. As a result, the opposing or reacting force of the packing 11 acts in a direction at the angle to the vertical direction. Thus, the vertical component of the opposing force (the component in the direction of the thickness of the enclosure), that tries to separate the upper enclosure 3 and the lower enclosure 4 from each other, becomes smaller than in the case where the packing is pressed in a vertical direction. In the present embodiment of the invention, therefore, it is possible to simplify the connecting mechanism between the upper enclosure 3 and the lower enclosure 4 while maintaining a good seal at the connection interface, between the upper enclosure 3 and the lower enclosure 4. That is, a good seal is maintained at a boundary between the steps of both portions of the enclosure.

In this sealing mechanism, the packing 11 is pressed and crushed in a direction at a proper angle to the vertical direction between the upper enclosure 3 and the lower enclosure 4, as described above. As a result, the opposing force of the packing 11 has a horizontal component that tries to expand the side wall portions of the upper enclosure 3 and the lower enclosure 4 in a lateral direction (perpendicular to the thickness of the enclosure). Therefore, there is a possibility that the right and left side wall portions 320, 330, 420, 430 disposed along the length of the enclosure may become opened by the above-described force which results in the packing 11 not being pressed enough. To avoid the above problem, in the present embodiment of the invention, two partition walls 461 and 462 are formed in an integral fashion in the lower enclosure 4 in its width direction. Presser walls 463, 464, and 465, 466 are formed at both ends of each partition wall thereby preventing the side wall portions 320, 330 of the upper enclosure 3 from being inwardly opened. Furthermore, a reinforcing element 467 extending in a slant direction is formed at the lower end of each presser wall 463–466 so as to increase the rigidity of the presser walls 463–466. The two partition walls 461, 462 also prevent the lower enclosure 4 from being bent.

As described above, an embodiment of the invention makes it possible to employ a simpler connecting mechanism than conventional techniques. Thus, in the present embodiment of the invention, unlike conventional techniques, the upper enclosure 3 and the lower enclosure 4 are connected to each other in a manner described below without using a plurality of fastening screws.

Figure 4C:
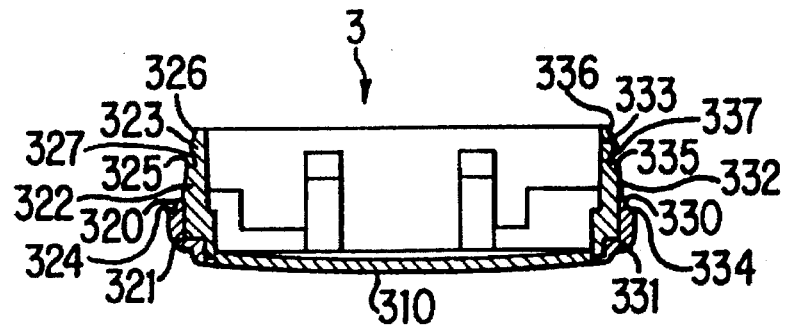
FIG. 4C is a cross-sectional view taken along the line 4C—4C of FIG. 4A.
Figure 4B:
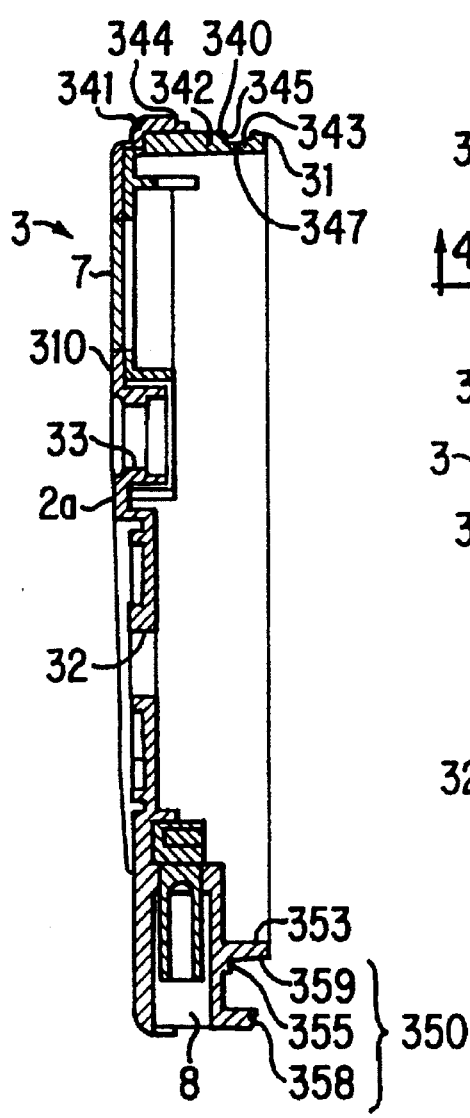
FIG. 4B is a cross-sectional view taken along the line 4B—4B of FIG. 4A.
Figure 4A:
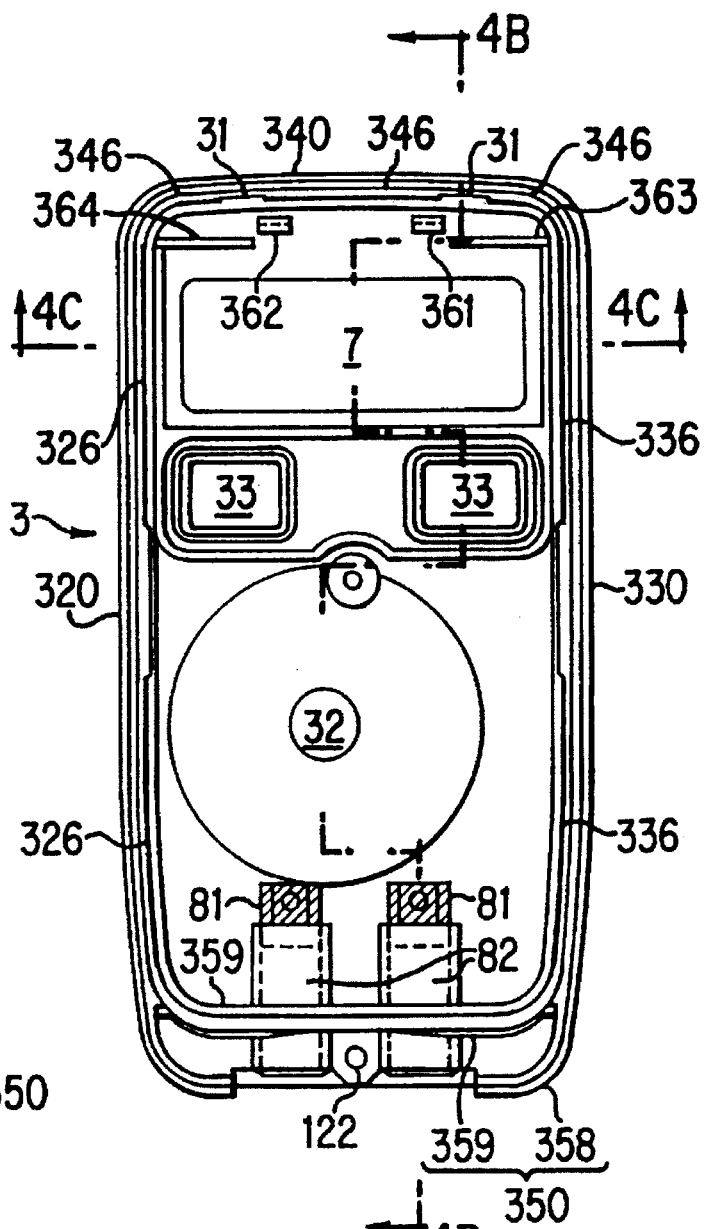
FIG. 4A is a schematic diagram illustrating the back side of the upper enclosure of the digital multimeter shown in FIG. 1.

As shown in FIG. 5F, the lower portion of the inner wall 446 of the lower enclosure 4 has an enclosure fastening screw hole 121 formed at its center position on its outer side. On the other hand, as shown in FIG. 4A, corresponding to the above screw hole 121, the inner wall 359 of the upper enclosure 3 has a screw hole 122, on the edge face of which a female thread is formed, at the center of the outer face of the inner wall 359. An enclosure fastening screw 12 is inserted into the screw holes 121 and 122 from a side of the lower enclosure 4 so that upper and lower enclosures 3 and 4 are fastened to each other.

On the other hand, opposite side walls 340 and 440 of the upper and lower enclosures 3 and 4 are provided with a pair of fitting mechanisms. That is, fitting projections 31 projecting outwardly are formed at two locations on the outer side face of the thin wall portion 343 of the side wall 340 of the upper enclosure 3. Corresponding to these fitting projections, fitting grooves 41, 41 for receiving the fitting projections 31, 31 are formed on the thick wall portion 441 of the side wall portion 440 of the lower enclosure 4.

Thus, the upper enclosure 3 and the lower enclosure 4 are fastened to each other by one enclosure fastening screw 12 and the pair of fitting mechanisms formed on the opposite side. Since this fastening is accomplished by only one enclosure fastening screw, it is possible to simplify the structure and to reduce the number of component elements for the digital multimeter. Thus, it also possible to reduce production costs. Furthermore, it is easy to assemble the enclosures. Although the connecting mechanism is greatly simplified, it is still possible to have a good seal at the connection interface between the upper and lower enclosures.

The enclosure fastening screw 12 is disposed at an outer location relative to the connection interface between the upper and lower enclosures 3 and 4. That is, the enclosure fastening screw 12 is disposed at an outer location relative to the location where the packing 11 is pressed between the steps 355 and 455. Using the above structure, water or dust cannot reach the location where the circuit board or other elements are disposed via the fastening position. Thus, there is no need to have an additional protection mechanism against water and dust. Therefore, it is possible to simplify the screw fastening structure.

The portion of each of the upper and lower enclosures where these enclosures are fastened by the screw 12 comprises an inner wall at which the packing 11 is placed. An outer wall is disposed at an outer position separated from the inner wall. In this structure, although there is no possibility that water or dust may come into the inside of the enclosure via the inner walls, water or dust may come into the space between the outer and inner walls. To avoid this above problem, in the present embodiment of the invention, drain holes 471, 471 are formed on both sides of the screw hole 121 of the lower enclosure, as shown in FIGS. 3A and 3B. The water coming into the space between the outer and inner walls can be drained through these drain holes 471 thereby preventing the water from accumulating.

As described above, the knob 5 of the rotary switch serving as one of the operating elements is disposed on the surface of the upper enclosure 3. A rotary shaft 51 is formed in an integral fashion in the center of a back face of the knob 5 of the rotary switch. The shaft 51 extends through the rotary switch fixing opening 32 formed in the upper enclosure and further into the inside of the enclosure wherein there is provided a fastening ring 55 on the back side of the upper enclosure 3 so that the shaft 51 is prevented from slipping off. A click rotor 52 that defines the rotary position of the rotary switch is fixed to the periphery of the shaft 51 extending inside the enclosure. A rotor 54 is attached to the back face of this clock rotor 52 such that a brush contact attached to the rotor 54 can slide on contacts formed on the circuit board 13 thereby making electrical contact with one of these contacts. A ring-shaped elastic sealing material or an O-ring 54 whose cross section has a circular shape is disposed between the shaft 51 of the rotary switch and the opening 32 thereby providing a sealing mechanism at a boundary between the shaft 51 and the opening 32.

In an embodiment of the invention, an O-ring fixing groove 51b is formed on a peripheral surface 51a of the rotary shaft 51 facing an edge face 32a of the fixing opening 32 so that the O-ring 54 is fitted in the O-ring fixing groove 51b. Thus, the O-ring 54 is disposed and pressed between the peripheral surface 51a of the rotary shaft 51 and the edge face 32a of the opening formed in the enclosure. In conventional techniques, this portion is sealed by an O-ring disposed between the back face of the knob 5 of the rotary switch and the outer surface of the upper enclosure 3 thereby pressing the O-ring in the vertical direction (along the thickness A of the enclosure). Where the O-ring is pressed in vertical directions, the knob 5 may have an angle relative to the surface of the upper enclosure 3 due to an inaccuracy in production of the knob 5 or due to a positioning error of the knob 5. The result is insufficient pressing against the O-ring which prevents a good seal from being achieved. In contrast, in the present embodiment of the invention, since the O-ring is pressed in a horizontal direction (B), it is possible to always achieve a good seal without such a problem.

A double sealing mechanism is provided for the seal between a rubber key 6 serving as an operating element and fixing openings 33 formed in the upper enclosure 3. The rubber key 6 comprises: a rectangular base portion 61; a pair of main rubber key portions 62, 62 formed on the base portion 61; and peripheral walls 63, 63 surrounding the main rubber key portions 62, 62. The upper faces of the main rubber key portions 62, 62 are exposed to the outside via fixing openings 33, 33 formed in the upper enclosure 3. On the back face of the upper enclosure 3 are provided peripheral grooves 33a surrounding the fixing openings 33, 33 such that the peripheral walls 63, 63 are fitted into the peripheral grooves 33a from the back side of the upper enclosure. The rubber key 6 is attached to the upper enclosure 3 by inserting the peripheral walls 63 into the peripheral grooves 33a surrounding the rubber key. A shielding plate 15 presses the rubber key 6 against the upper enclosure 3 thereby fixing the rubber key 6.

Figure 8:
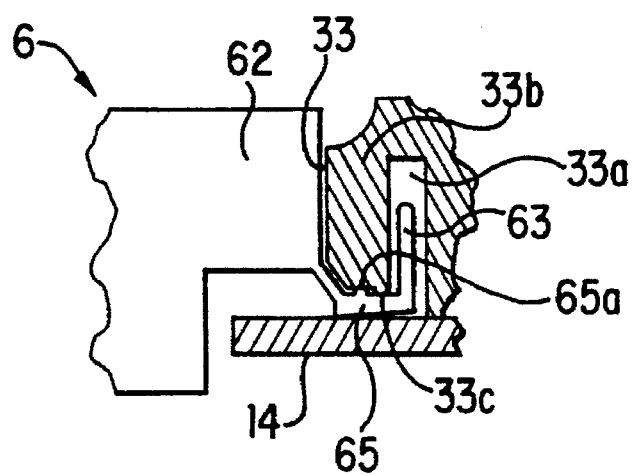
FIG. 8 is an enlarged fragmentary cross-sectional view illustrating a sealing mechanism according to an embodiment of the invention for sealing a peripheral boundary of a rubber key of the digital multimeter shown in FIG. 1.

As shown in FIG. 8 in an enlarged fashion, an uneven surface structure 33c is formed at an end portion of a peripheral wall 33b of each peripheral groove 33a surrounding an opening 33. The uneven surface 33c is in contact with the surface of a connecting portion 65 between the main rubber key portion 62 and the peripheral wall 63 of the rubber key. A connecting portion 65 has an uneven surface structure 65a corresponding to the uneven surface structure 33c formed on the upper enclosure. These uneven surfaces 33c and 65a are pressed against each other by a pressing force of the shielding plate 15 acting from the back side of the upper enclosure.

As described above, the seal between the rubber key 6 and the fixing opening is achieved by the double sealing mechanism comprising the uneven surface structures 33c and 65a. This allows for a better seal at this portion than realized by conventional techniques, thus preventing water or dust from entering the enclosure via this sealing portion.

The above-described upper enclosure 3 and the lower enclosure 4 are formed by molding a synthetic resin material into a desired shape. The upper enclosure 3 is formed using a two-color molding technique so that the transparent display window 7 is also formed from a different material in an integral fashion. That is, the upper enclosure 3 is made up of an ABS resin, and the transparent display window 7 is made up of a polycarbonate resin. A perfect seal can be achieved at a boundary between these portions made up of different materials because these portions are formed in an integral fashion by means of the two-color molding technique. In contrast, in conventional techniques, a transparent glass plate for the transparent display window 7 is separately formed, and welded to the opening formed in the upper enclosure 3 by means of ultrasonic welding or the like. The monolithically molded enclosure according to the present invention provides a more reliable seal than enclosures made by welding separate elements.

In the production of the upper enclosure 3 by means of the two-color molding technique according to the present embodiment of the invention, not only the transparent display window 7 but also the side wall portions 320, 330, 340, 350 are formed using a polycarbonate resin. In FIGS. 4B and 4C, the side wall portions inside the broken lines are formed of a polycarbonate resin, and the portion outside the broken lines is formed of an ABS resin. In this way, according to the present embodiment of the invention, the thick portions of the side wall portions 320–350 allow the upper and lower enclosures to get into sufficient engagement with each other, and also produce enough of a distance to electrically isolate internal circuits from a human body for safety.

When the upper enclosure 3 is formed by means of a two-color molding technique, input terminals are also formed by means of an insert molding technique. External terminal insertion holes 8, 8 are formed in the lower side face 2f of the enclosure. Input terminals 81 are disposed at a location on the inner side of the lower side face 2f so that the input terminals 81 can connect the external terminals to the electrical circuits mounted on the circuit board 13 disposed inside the enclosure.

Figure 9A:
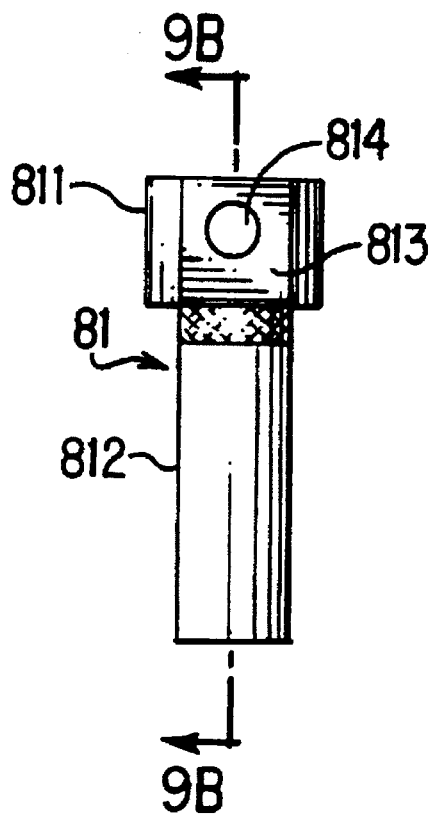
FIG. 9A is a schematic diagram illustrating a plan view of an input terminal of the digital multimeter shown in FIG. 1.
Figure 9B:
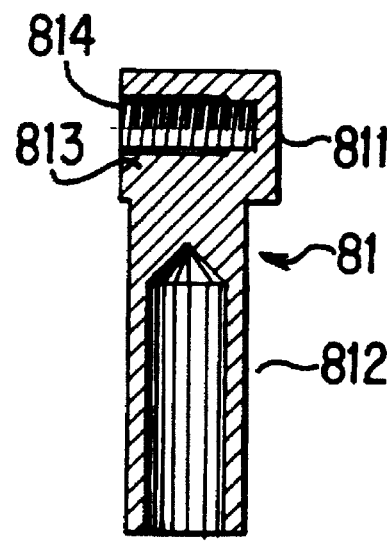
FIG. 9B is a cross-sectional view taken along the line 9B—9B of FIG. 9A.
Figure 9C:
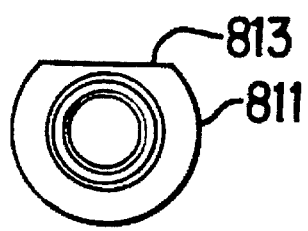
FIG. 9C is a side view illustrating the head of the input terminal shown in FIG. 9A.

As shown in FIG. 9, each input terminal 81 comprises a head 811 formed in a cylindrical shape. A cylinder leg 812, having a smaller diameter, is connected continuously to the head 811. A hole is formed at the end of the leg 812 so that an external terminal can be inserted into it. The head 811 has a flat face portion 813 formed on a part of its peripheral side face. A screw hole 814 is formed in the center of the flat face portion 813 such that the screw hole 814 extends along a diameter of the head. The input terminals 81 having the above-described structure are formed by means of the insert molding technique into two input terminal fitting portions 82, each having an external terminal insertion hole 8 formed in the upper enclosure 3.

As shown in FIG. 3B, the input terminals 81 are attached such that the flat face portion 813 formed on the head 811 of each input terminal faces the circuit board 13. A screw 83 is inserted into each screw hole 814 from the side of the circuit board 13 so that the flat face portion 813 comes into close contact with an input terminal connection element (not shown) formed on the surface of the circuit board 13.

In the input terminal 81 according to one embodiment of the invention, a flat face portion 813 is formed on a part of the circular peripheral face of the head 811, as described above. This flat face portion makes it easier to produce and assemble an input terminal and associated elements. That is, in the insert molding process, the flat face portion can be used as a reference face for positioning the input terminal. Furthermore, the input terminal can be easily connected to the circuit board 13 so that the flat face portion 813 comes in close contact with the circuit board 13.

Now, referring to FIGS. 2 and 3, the internal structure of the enclosure 2 comprising the upper enclosure 3 and lower enclosure 4 will now be described. In the inside of the enclosure 2, as described earlier, the circuit board 13 on which circuit elements are mounted, is disposed at the center of the thickness A of the enclosure 2 along a plane B substantially parallel to the upper and lower enclosures 3 and 4; that is, in the direction perpendicular to the thickness direction A of the enclosure 2. A liquid crystal display panel 14 is disposed on the back face of the upper enclosure 3 at a position corresponding to the display window 7. A shielding or protecting plate 15 is disposed between the liquid crystal display panel 14 and the circuit board 13. In the lower enclosure 4, there is provided a battery holder 17 at a location opposite to the shielding plate 15 via the circuit board 13. Two batteries 18 are installed in the battery holder 17 in this example.

In the circuit board 13, a circuit pattern is formed on a surface 13a of the circuit board facing toward the upper enclosure 3. Circuit elements such as integrated circuit chips are mounted on it. The upper and lower portions are shielded from each other by the circuit board 13 and the shielding plate 15. On an opposite surface 13b of the circuit board, there are provided two pairs of connecting terminal plates 131, 132, 133, 134 at positions corresponding to the battery holder 17. The connecting terminal plates project toward the battery holder. The circuit board 13 is fixed to the upper enclosure 3 via the two screws 83, 83 which are also used to fastening the above-described input terminal 81. A screw hole 135 is formed in the center of the circuit board 13. A screw hole 136 is formed in the upper enclosure 3 at the position corresponding to the screw hole 135. The circuit board 13 is also fastened to the upper enclosure 3 using a fastening screw 137 via the screw hole 136. Furthermore, a pair of fitting projections 361, 361 are formed on the inner wall face of the upper side wall 340 of the upper enclosure 3. Holder walls 363 and 364 are formed adjacent to the pair of fitting projections 361, 361 such that the holder walls project inward along the thickness direction A from the upper wall 310 of the upper enclosure 3 (refer to FIGS. 4A–C). One end of the circuit board 13 is held between the fitting projections and the holder walls.

Figure 10B:
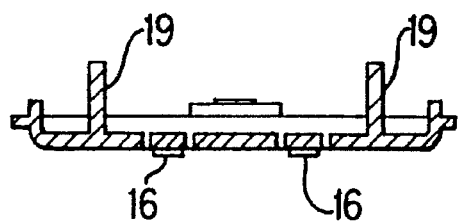
FIG. 10B is a cross-sectional view taken along the line 10B—10B of FIG. 10A.
Figure 10A:
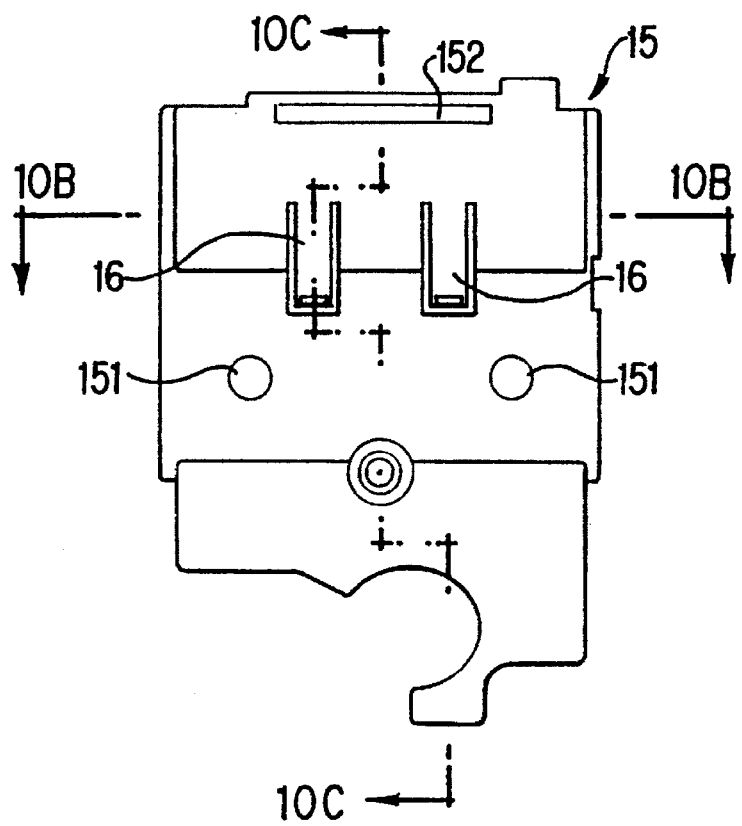
FIG. 10A is a schematic diagram illustrating a plan view of a shielding plate of the digital multimeter shown in FIG. 1.
Figure 10C:
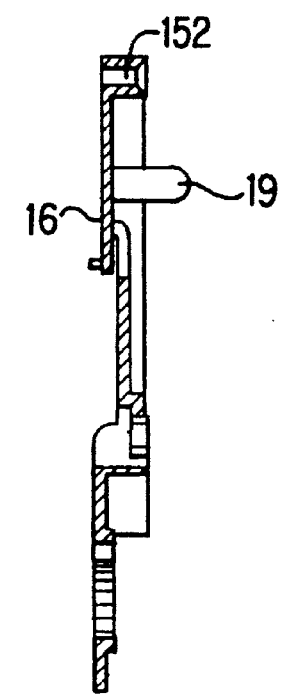
FIG. 10C is a cross-sectional view taken along the line 10C—10C of FIG. 10A.

As shown in FIGS. 10A–C, on the shielding or protecting plate 15 disposed between the circuit board 13 and the upper enclosure 3, a pair of elastic projections 16, 16 are formed at locations facing the liquid crystal panel 14. Each elastic projection 16 is formed at an end of a U-shaped cut-out portion formed in the shielding plate 15 such that the elastic projection 16 extends toward the liquid crystal panel 14. Thus, when the circuit board 13 is fastened via the shielding plate 15 to the upper enclosure 3 using the three screws 83, 83, 137, the liquid crystal panel 14 is elastically pressed by the ends of the elastic projections 16, 16 against the transparent of the display window 7 of the upper enclosure 3 and fixed there.

In this embodiment of the invention, since the liquid crystal panel 14 is fixed elastically by the pressure of the elastic projections as described above, even if the digital multimeter 1 falls down or a similar mechanical shock is applied, the elastic projections 16, 16 holding the liquid crystal panel 14 absorb the mechanical shock, thereby protecting the liquid crystal panel 14. In this way according to the present embodiment of the invention, elastic projections are effectively used to construct a fastening mechanism for the liquid crystal panel having excellent shock-absorbing performance.

Furthermore, the shielding or protecting plate 15 has a pair of battery holding projections 19, 19 formed at positions corresponding to the battery holder 17 disposed in the lower enclosure 4. The pair of battery holding projections extend in a vertical direction toward the lower enclosure 4. These projections 19, 19 extend via through-holes 191, 191 formed in the circuit board 13 toward the battery holder 17. As shown in FIG. 3B, these projections 19 are designed to have a proper length so that the end of each projection 19 just reaches the upper portion of a peripheral side face of each of two batteries 18 installed in the battery holder 17.

The battery holder 17 disposed in the lower enclosure 4 will now be described in more detail. As shown in FIG. 5, the battery holder 17 comprises partition walls 171–176 formed at six locations on a lower wall 410 of the lower enclosure 4 such that these partition walls prevent the two batteries 18, 18 from moving in a direction along the plane B. Furthermore, there are provided three slipping-off protection plates 177, 178, 179 in a curved shape corresponding to the peripheral side face of the battery thereby preventing the batteries from slipping off in the thickness direction A. However, the distance between the two slipping-off protection plates 177, 178 and the slipping-off protection plate 179 disposed at the opposite location is set to a value such that batteries can be mounted and removed through the space between these slipping-off protection plates. Therefore, there is a possibility that the batteries 18 may leave the battery holder 17 when the digital multimeter is dropped or when a similar mechanical shock is applied. This may damage the circuit board 13 or some other elements.

In practice, the above problem does not occur in the present embodiment of the invention, because there are provided a pair of battery holding projections 19, 19 on the shielding plate 15. Two batteries installed in the battery holder 17 are pressed toward the lower enclosure 4 by the pair of projections and held there, as described earlier. Thus, these projections 19 prevent the batteries from falling out even when a mechanical shock is applied to the digital multimeter. Furthermore, unlike conventional techniques, the batteries are installed on the side opposite to that where the circuit board 13 is disposed, thereby achieving a high shock resistance digital multimeter.

In this embodiment of the invention, the shielding plate 15 is fastened by the screw 137 to the upper enclosure 3 such that electrical shielding of the circuit board is achieved by the screw.

Of the circuit elements mounted on the circuit board 13, heavy elements or elements that may come off due to mechanical shock are fixed by a mechanism according to the present invention.

In one embodiment of the invention, as can be understood best from FIG. 3C, there is provided a presser plate 155 on the surface of the shielding plate 15 facing toward the circuit board 13, thereby preventing a crystal resonator element 138 soldered to the circuit board from separating from the circuit board. In conventional techniques, the crystal resonator element is generally connected to the circuit board and thus fixed on the circuit board. However, this process is time consuming. In contrast, in the present embodiment of the invention, since there is provided a presser plate 155, the circuit element can be fixed without the connecting process.

Furthermore, an electric fuse is disposed on an input terminal fitting portion 82 as shown in FIGS. 3A and 3B. A pair of projections 481, 481 are disposed in the lower enclosure 4 so as to prevent the fuse 139 from moving in the lateral direction (perpendicular to the thickness direction A) due to mechanical shock.

A pair of holes 151, 151 are formed in the shielding plate 15 so that contact points of the rubber keys can make contact with the contact points formed on the circuit board 13 via the holes 151, 151. Furthermore, an opening 152 with a long rectangular shape is formed at one end of the shielding or protecting plate 15. A rectangular conductive rubber 153 is disposed in the opening 152 thereby providing electrical connections between the circuits on the circuit board 14 and the liquid crystal panel 14.

As described above, the input terminals 81 are attached such that the flat face portion 813 formed on the head 811 of each input terminal faces toward the circuit board 13. A screw 83 is inserted into each screw hole 814 from a side of the circuit board 13 so that the flat face portion 813 comes into close contact with an input terminal connection element (not shown) formed on the surface of the circuit board 13. This connection method, in which the input terminal 81 is fixed to the electrical contact of the circuit board 13 via the screw, results in an improvement in resistance against mechanical shock, such as shock from being dropped as opposed to conventional techniques in which the connection is performed by means of soldering.

In the embodiments described above, there are provided fixing mechanisms for fixing a fuse and a crystal resonator element. However, the present invention is not limited only to those. The present invention may also be applied to fixing mechanisms for fixing various types of elements.

In the digital multimeter according to the invention, the display panel is held by an elastic force by the elastic projection disposed on the shielding plate so that the elastic projection serves as a buffer element and absorbs mechanical shock thereby preventing the display panel from being damaged by direct mechanical shock.

Furthermore, in the invention, the battery is pressed toward the enclosure by the battery holding projection disposed on the shielding or protecting plate. Thus, a battery having a great weight is fixed to the side of the enclosure. The battery is prevented from moving and further leaving the given position. Thus, other circuit elements and the circuit board are prevented from being damaged.

In the invention, furthermore, the shielding plate is disposed in such a manner that the shielding or protecting plate is supported on the side of the enclosure. With this structure, mechanical shock or vibration is cut off by the shielding plate and the enclosure. Thus, mechanical shock is not applied to the internal circuit board and to the circuit elements mounted on it. Thus, the circuit board and the circuit elements are protected from mechanical shock.

Furthermore, in the invention, at least either the upper enclosure or the lower enclosure is provided with a holding projection for fixing at least one of the circuit elements mounted on the surface of the circuit board. With this arrangement, heavy circuit elements or such circuit elements that may leave their given position when mechanical shock is applied are firmly fixed, which prevents the separation of these elements from the circuit board.

Furthermore, in the invention, an input terminal used for connection with an external terminal, that may leave its given position when mechanical shock or vibration is applied, is fixed to the circuit board using a screw. With this arrangement, it is possible to improve the resistance of this portion against mechanical shock.

As described above, the invention provides a digital multimeter having excellent resistance against mechanical shock.

While advantageous embodiments have been chosen to illustrate the invention, it will be understood by those skilled in the art that various changes and modifications can be made therein, without departing from the scope of the invention as defined in the appended claims.

What is claimed is:

1. A digital multimeter comprising an enclosure which comprises an upper enclosure and a lower enclosure, further comprising:

a circuit board on which circuit elements are mounted;

a protecting plate for protecting the circuit elements mounted on said circuit board;

a battery holder; and a display panel disposed at a back side of a transparent display window in said upper enclosure, wherein said protecting plate is provided with one or more elastic projections which elastically press said display panel toward said upper enclosure.

2. The digital multimeter according to claim 1, wherein said protecting plate is further provided with a battery holding projection for holding said battery against said enclosure.

3. The digital multimeter according to claim 2, wherein said protecting plate is disposed between said circuit board and said upper enclosure, said protecting plate being supported on a side of said enclosure; and further comprising a battery holder for holding said battery disposed in said lower enclosure at a position corresponding to said protecting plate, said battery holding projection extending from said protecting plate toward said battery holder through said circuit board.

4. The digital multimeter according to claim 3, wherein at least either of said upper enclosure or said lower enclosure is provided with a holding projection for fixing at least one circuit element of said circuit elements mounted on a surface of said circuit board.

5. The digital multimeter according to claim 4, wherein said holding projection is a projection for holding a fuse, said projection being formed in said lower enclosure.

6. The digital multimeter according to claim 4, wherein said protecting plate is provided with a holding projection for fixing at least one circuit element of said circuit elements mounted on the surface of said circuit board.

7. The digital multimeter according to claim 5, wherein said protecting plate is provided with a holding projection for fixing at least one circuit element of said circuit elements mounted on the surface of said circuit board.

8. The digital multimeter according to claim 6, wherein said holding projection is a projection for holding a crystal resonator element.

9. The digital multimeter according to claim 7, wherein said holding projection is a projection for holding a crystal resonator element.

10. The digital multimeter according to claim 1, further including an input terminal used for connection with an external terminal, said input terminal being fixed to said circuit board using a screw.

11. A digital multimeter comprising an enclosure which comprises an upper enclosure and a lower enclosure, comprising:

a circuit board on which circuit elements are mounted;

a protecting plate for protecting the circuit elements mounted on said circuit board and located between the circuit board and a display panel;

a battery;

the display panel disposed at a back side of a transparent display window in said upper enclosure, and wherein said protecting plate is provided with one or more battery holding projections which extend through the circuit board and press said battery against said enclosure.

12. A digital multimeter comprising an enclosure which comprises an upper enclosure and a lower enclosure, comprising:

a circuit board on which circuit elements are mounted;

a protecting plate for protecting the circuit elements mounted on said circuit board, the protecting plate located between the circuit board and a display panel;

a battery holder; and the display panel disposed at a back side of a transparent display window in said upper enclosure, wherein at least one of said upper enclosure or said lower enclosure is provided with a holding projection which fixes in place at least one of the circuit elements mounted on a surface of said circuit board.

13. The digital multimeter according to claim 12, wherein said holding projection is a projection for holding a fuse, said projection being formed in said lower enclosure.

14. A digital multimeter according to claim 12, wherein said protecting plate is provided with a holding projection for fixing at least one circuit element of said circuit elements mounted on the surface of said circuit board.

15. The digital multimeter according to claim 13, wherein said protecting plate is provided with a holding projection for fixing at least one circuit element of said circuit elements mounted on the surface of said circuit board.

16. A digital multimeter according to claim 14, wherein said holding projection is a projection for holding a crystal resonator element.

17. The digital multimeter according to claim 15, wherein said holding projection is a projection for holding a crystal resonator element.

18. The digital multimeter according to claim 17, wherein said protecting plate is disposed in such a manner that said protecting plate is supported on a side of said enclosure.

19. A digital multimeter according to claim 12, further comprising an input terminal used for connection with an external terminal, said input terminal being fixed to said circuit board using a screw.

20. A digital multimeter comprising an enclosure which comprises an upper enclosure and a lower enclosure, comprising:

a circuit board on which circuit elements are mounted;

a protecting plate for protecting the circuit elements mounted on said circuit board, the protecting plate located between the circuit board and a display panel;

a battery holder; and the display panel disposed at a back side of a transparent display window in said upper enclosure, wherein said protecting plate is provided with a holding projection which fixes in place at least one of the circuit elements mounted on a surface of said circuit board.

21. The digital multimeter according to claim 20, wherein said holding projection is a projection for holding a crystal resonator element.

22. The digital multimeter according to claim 21, wherein said protecting plate is disposed in such a manner that said protecting plate is supported on a side of said enclosure.

23. The digital multimeter according to claim 22, further comprising an input terminal used for connection with an external terminal, said input terminal being fixed to said circuit board using a screw.

24. The digital multimeter according to claim 11, wherein said protecting plate is supported on a side of said enclosure.

25. The digital multimeter according to claim 24, wherein at least either of said upper enclosure or said lower enclosure is provided with a holding projection for fixing at least one circuit element of said circuit elements mounted on a surface of said circuit board.

26. The digital multimeter according to claim 25, wherein said holding projection is a projection for holding a fuse, said projection being formed in said lower enclosure.

27. The digital multimeter according to claim 25, wherein said protecting plate is provided with a holding projection for fixing at least one circuit element of said circuit elements mounted on the surface of said circuit board.

28. The digital multimeter according to claim 26, wherein said protecting plate is provided with a holding projection for fixing at least one circuit element of said circuit elements mounted on the surface of said circuit board.

29. The digital multimeter according to claim 27, wherein said holding projection is a projection for holding a crystal resonator element.

30. The digital multimeter according to claim 11, further comprising an input terminal used for connection with an external terminal, said input terminal being fixed to said circuit board using a screw.

31. The digital multimeter according to claim 29, further comprising an input terminal used for connection with an external terminal, said input terminal being fixed to said circuit board using a screw.

* * * * *